United States Patent [19]
Evers et al.

[11] Patent Number: 5,962,862
[45] Date of Patent: Oct. 5, 1999

[54] METHOD AND APPARATUS FOR VERIFYING THE PRESENCE OR ABSENCE OF A COMPONENT

[75] Inventors: Sven Evers; Kevin Gibbons; Edward A. Schrock, all of Boise, Id.

[73] Assignee: Micron Technology, Inc., Boise, Id.

[21] Appl. No.: 08/909,570

[22] Filed: Aug. 12, 1997

[51] Int. Cl.$^6$ .................................................. H01L 21/00
[52] U.S. Cl. ..................................... 250/559.4; 356/237.1
[58] Field of Search ...................... 250/559.4; 356/237, 356/237.1, 237.4, 237.6

[56] References Cited

U.S. PATENT DOCUMENTS

| | | | |
|---|---|---|---|
| 3,583,561 | 6/1971 | Wiesler et al. | 209/73 |
| 4,323,311 | 4/1982 | West et al. | 356/431 |
| 4,711,579 | 12/1987 | Wilkinson | 356/375 |
| 4,737,649 | 4/1988 | Naruse | 250/562 |
| 4,759,675 | 7/1988 | Bond et al. | 414/222 |
| 4,817,093 | 3/1989 | Jacobs et al. | 371/25 |
| 5,118,957 | 6/1992 | Kawashima et al. | 250/561 |
| 5,392,360 | 2/1995 | Weindelmayer et al. | 382/151 |
| 5,654,204 | 8/1997 | Anderson | 438/15 |
| 5,760,892 | 6/1998 | Koyama | 356/237 |
| 5,787,190 | 7/1998 | Peng et al. | 382/145 |

OTHER PUBLICATIONS

Zmation, Inc. advertisement, Semiconductor International, Oct., 1996, p. 254.

*Primary Examiner*—Edward P. Westin
*Assistant Examiner*—Thanh X. Luu
*Attorney, Agent, or Firm*—Kirkpatrick & Lockhart LLP

[57] ABSTRACT

Apparatuses and methods are disclosed for verifying the presence or absence of a die in a location, dice in a cut wafer or other components in a pattern. The apparatuses includes a wafer support, a radiation source, a radiation detector and a controller. The radiation source is positioned to direct radiation toward the wafer support and a radiation detector is positioned to detect radiation from the direction of said wafer support. Preferably, a visible light source, such as an arc lamp, is used to illuminate a wafer from the substrate side of the wafer and a charge coupled device (CCD) camera is positioned to detect light from the light source passing through locations in the wafer where the dice have been removed. The charge coupled device camera is connected to the controller, which is preferably a computer connected to a display monitor. The computer calculates the location of the removed dice based on the intensity of the detected light and produces a wafer verification map based on the calculated locations. The wafer verification map is compared to a planned or selected die pick pattern map of dice that were to be picked to identify any mispicked dice. In alternative embodiments, the apparatus can be included semi-integrally or integrally with a die attach machine to provide in-line verification of the die pick process. In a fully integral embodiment of the method, the picked die can be verified as correct prior to being placed onto a substrate.

21 Claims, 4 Drawing Sheets

METHOD AND APPARATUS FOR VERIFYING THE PRESENCE OR ABSENCE OF A COMPONENT

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention is directed generally to determining the presence or absence of an object and, more particularly, to verifying the presence or absence of individual dice in a semiconductor wafer that has been cut to separate the individual dice and from which any number of dice have been removed.

Integrated circuits are solid state devices in which electrical components and electrical connections between the components are incorporated into a solid matrix by the strategic placement of various conducting, semiconducting and insulating materials to form and encapsulate the desired circuit in the composite solid matrix. The development of the integrated circuit has led to the miniaturization of electronics by providing a strong matrix to support and protect fragile miniaturized components and connections and by facilitating the placement of the electrical components in close proximity. The integrated circuit has further served to increase the reliability of electronic devices by the elimination of moving parts and fragile electrical wiring and connections.

Integrated circuits are typically mass produced by forming hundreds of circuits, called dice, on a wafer shaped semiconductor substrate, or "wafer". The circuits are formed by depositing a series of individual layers of predetermined materials on the wafer. The individual layers of the integrated circuit are, in turn, produced by a series of manufacturing steps. The precise characteristics of the layers, such as composition, thickness, surface quality, uniquely determine the electronic properties and the performance of the integrated circuit.

The completed circuits are tested to identify circuits that perform according to a design specification, called "good dice", and those circuits that do not perform within specification, "bad dice" The precise location of the individual dice and whether the dice are good or bad is stored for later use in the form of a wafer map.

Following the completion of the circuits, the wafer is cut to separate the individual dice for further processing. Prior to cutting, an adhesive film is attached to the substrate side of the wafer, opposite the circuit layers, to hold the dice in place following the cutting operation. The individual dice are removed from the cut wafer using a die attach machine or another type of pick and place machine. Typically, the locations of the good dice are identified from the wafer map and the pick and place machine is used to pick the good dice from the wafer and place the dice onto substrates, such as lead frames containing the external electrical connections for the integrated circuit, personal computer boards or other mounting surfaces.

Occasionally, due to errors in the manufacturing process, such as wafer or machine misalignment or mechanical wear, a die will be mispicked from the wafer and a bad die may be attached to the substrate. As a result, a bad die may continue through subsequent processing steps until subsequent testing identifies the bad die, at which time the bad die can be removed from the process stream. The continued processing of the bad dice decreases productivity and yield because of wasted manufacturing time and materials.

In addition, generally only the good dice are removed from the wafer, presumably leaving only bad dice on the wafer. Therefore, if a good die remains in the wafer and is inadvertently discarded as a bad die, productivity and yield will be further decreased.

Currently, following the removal of the dice from the wafer, personnel manually inspect the wafer to verify that the correct dice were removed from the wafer and to determine whether any good dice have been inadvertently missed on the wafer or if any bad dice have been placed into subsequent processing stages. The verification procedure is very time consuming making it difficult to identify and remove bad die from the process stream in a timely manner. As such, the present procedure does not prevent the additional waste of manufacturing time and materials on bad dice. In addition, the verification procedure itself is subject to error due to the tedious nature of the procedure, so the present procedure also may not prevent the inadvertent discarding of good dice.

Thus, the need exists for verification apparatuses and methods which overcomes, among others, the above-discussed problems so as to provide for determination and verification of the presence of bad dice remaining in the process stream and to identify good dice being inadvertently removed from the process stream.

BRIEF SUMMARY OF THE INVENTION

The above objectives and others are accomplished by methods and apparatuses in accordance with the present invention. An apparatus for verifying the presence or absence of a die at a location in the wafer or dice in a pattern in a cut wafer includes a wafer support, a radiation source, a radiation detector and a controller. The radiation source, preferably a visible light source, such as an arc lamp, is positioned to direct radiation toward the wafer support. The radiation detector, preferably a charge coupled device camera, is positioned relative to the wafer support and the radiation source to detect radiation from the direction of the wafer. The radiation detector can be used to detect the intensity of the radiation at a specific location on the wafer or in a radiation pattern. Preferably, the visible light is used to illuminate the wafer from the substrate side of the wafer and the charge coupled device camera is positioned to detect light passing through locations in the wafer where the dice have been removed. The radiation detector is connected to the controller which is preferably a computer connected to a display monitor having sufficient memory and computational power to determine the location and produce a location map of the die or dice based on the detected radiation. In alternative embodiments, the apparatus can be included semi-integrally or integrally with a die attach machine to provide in-line verification of the die pick process.

In methods of the invention, radiation is directed toward the wafer from a radiation source, and, a radiation detector is positioned to detect radiation from the direction of the wafer, preferably radiation passing through locations where dice have been removed. The detected radiation is used to calculate the locations where the die or dice have been removed and where the dice remain. In a preferred embodiment, the calculated locations are used to produce a wafer verification map that is compared to a planned, or selected, die pick pattern map of dice that were to be picked to identify any mispicked dice.

In a fully integral embodiment of the method, a wafer map is produced to identify the location of the dice in a wafer. The dice are tested to determine whether the dice perform according to predetermined specifications and the performance information is stored with the map. A die is selected to be placed on a substrate, e.g., a lead frame, a mounting surface, a personal computer (PC) board, etc. and the location of the die is identified from the wafer map and the die is picked. Radiation is directed toward the wafer and detected from the direction of the wafer. The location of the picked die is calculated based on the radiation detected to determine whether the picked die is the selected die. If the picked die is the selected die, the picked die is placed on the substrate. If the picked die is not the selected die, then the controller determines whether the picked die performed according to the predetermined specification, and if so, the picked die is assigned to and placed on the substrate. If the picked die did not perform to specification, then the die is discarded in an appropriate manner.

Accordingly, the present invention provides an effective solution to problems heretofore encountered with determining the presence of bad die remaining in the process stream and identifying good die being inadvertently removed from the process stream. The present invention presents a dual solution to the bifurcated problem resulting in an increase in two measures of productivity. These advantages and others will become apparent from the following detailed description.

BRIEF DESCRIPTION OF THE DRAWINGS

Preferred embodiment of the invention will now be described, by way of example only, with reference to the accompanying Figures wherein like members bear like reference numerals and wherein.

DETAILED DESCRIPTION OF THE INVENTION

Figure 1:
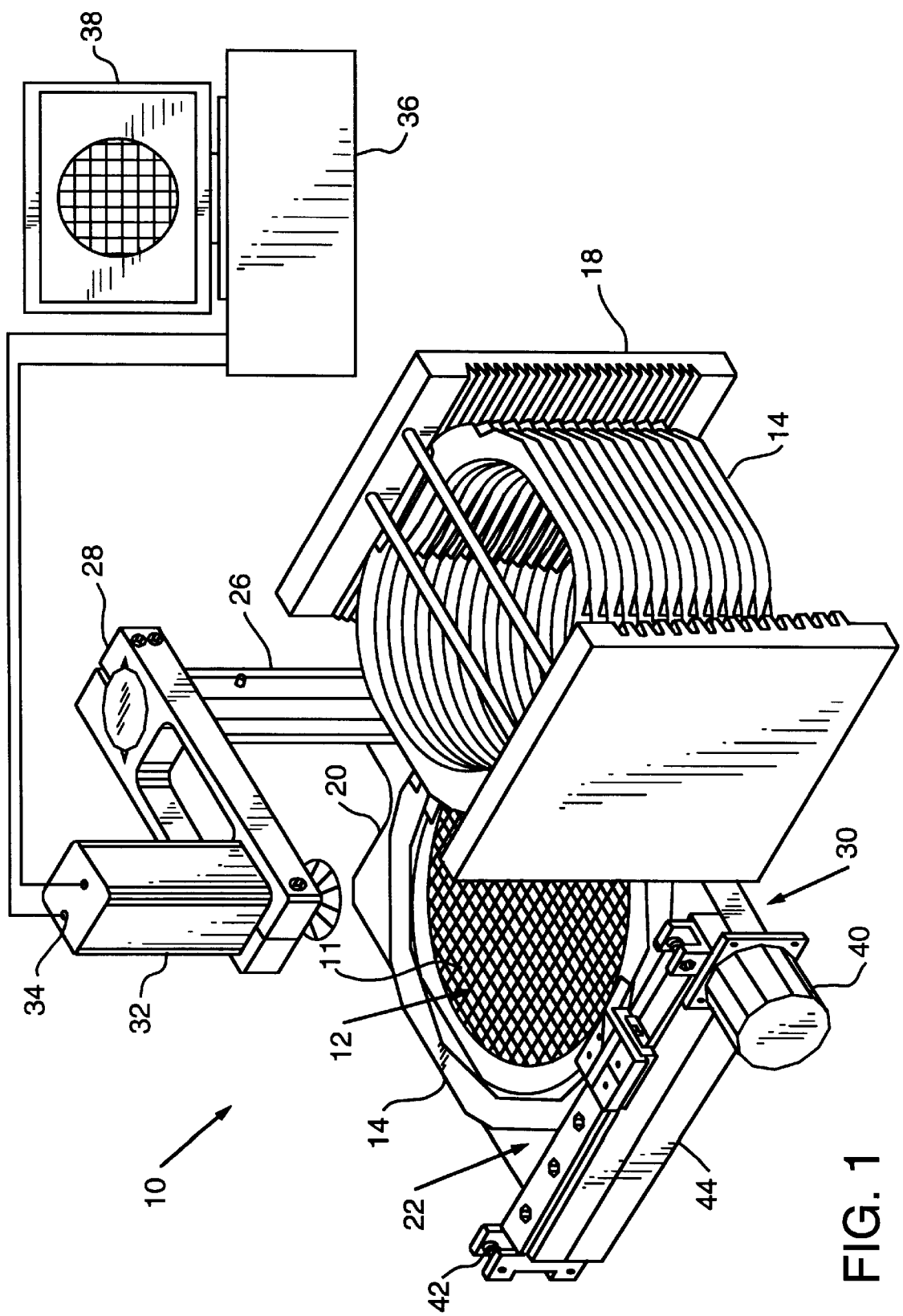
FIG. 1 is a stand-alone embodiment of the apparatus of the present invention, a wafer carrier containing wafer frames positioned adjacent thereto.

The operation of the apparatus 10 will be described generally with reference to the drawings for the purpose of illustrating the present preferred embodiments of the invention only and not for purposes of limiting the same. The apparatus 10 is shown in FIG. 1 in a stand alone configuration, but the apparatus 10 can also be constructed integrally with other apparatuses, such as die attach and other pick and place machines. The apparatus 10 is used to verify the correct removal of integrated circuits, or dice, 11 from a semiconductor wafer 12 that has been cut to separate the individual dice 11. Prior to cutting, the wafers 12 is typically attached to an adhesive film that holds the dice 11 in place after the wafer 12 is cut. The adhesive film is supported by a frame assembly 14 containing alignment notches 16. In the stand alone mode, the wafers 12 are either manually or automatically removed from a wafer carrier 18 and placed on the apparatus 10. Generally, the apparatus 10 includes a support 20, a radiation source 30, and a radiation detector 32. The wafer 12 is placed on the support 20 and the radiation source 30 is positioned to direct radiation toward the wafer 12. The radiation detector 32 is positioned to detect radiation from the direction of the wafer 12. The detected radiation can be in the form of an intensity from a specific location, an intensity pattern corresponding to the wafer or in other detectable forms. The detector 32 is used to convert the detected radiation into a receiver signal which is used to identify the pattern of the remaining dice 11 in the wafer 12 and the dice 11 that have been removed from the wafer 12.

In a preferred embodiment, the support 20 has a support surface 22 containing wafer frame alignment pins 24 to properly align and orient the wafer 12 to a common reference for use in calculating the absolute location of the dice 11 in the wafer 12. Alternatively, a reference point can be provided on the wafer itself or the frame assembly 14 to decrease the alignment precision required of the personnel placing the wafers on the apparatus 10.

The support 20 is preferably ring shaped with the inside of the ring being sufficiently open to allow radiation, preferably in the form of visible light, to pass through the support 20 and fall upon the entire cross sectional area of the dice 11, when the wafer 12 is positioned on the support surface 22.

Figure 2:
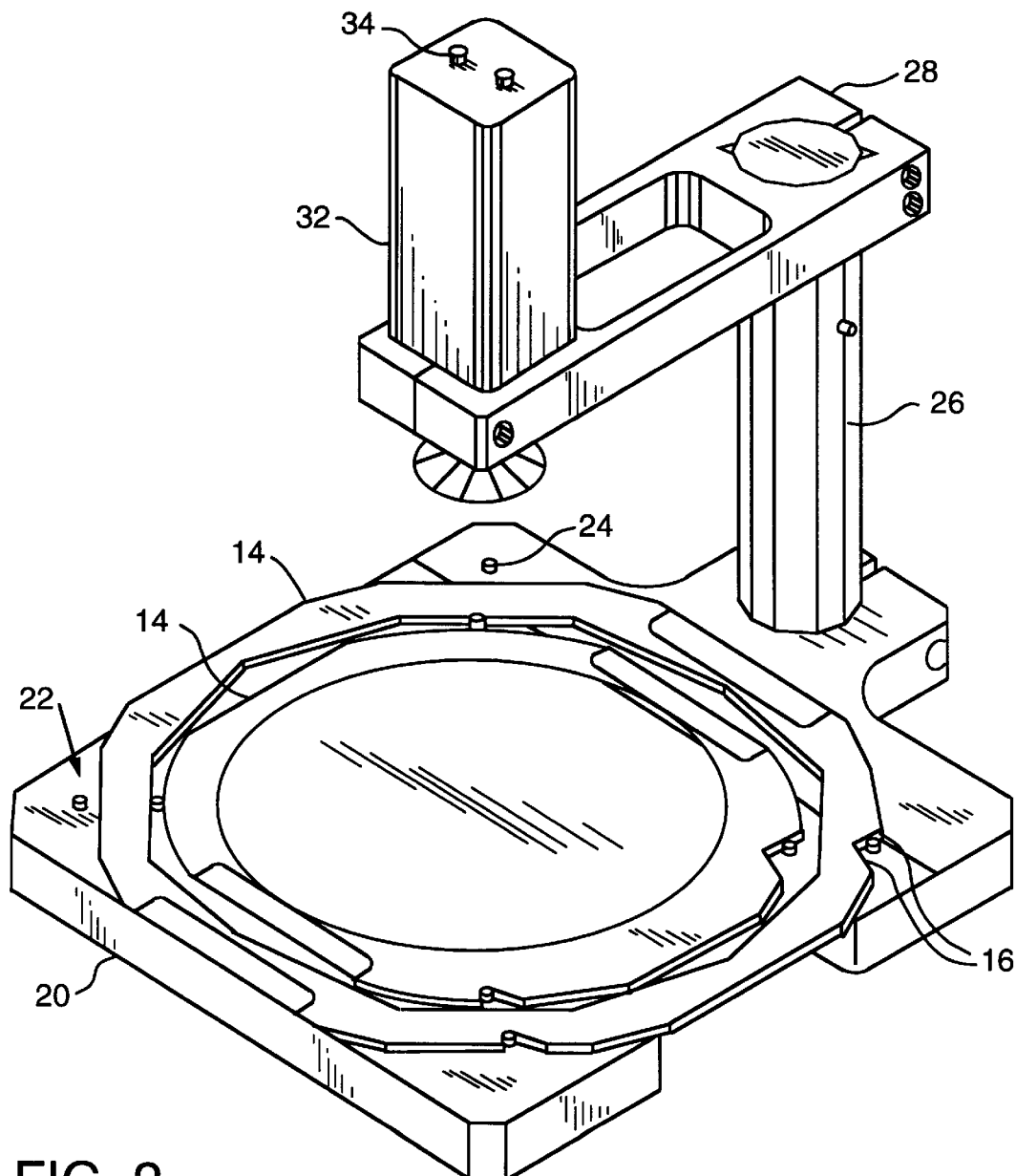
FIG. 2 is a wafer support and detector arrangement of an apparatus of the present invention with two different size frames positioned on the support.
Figure 3:
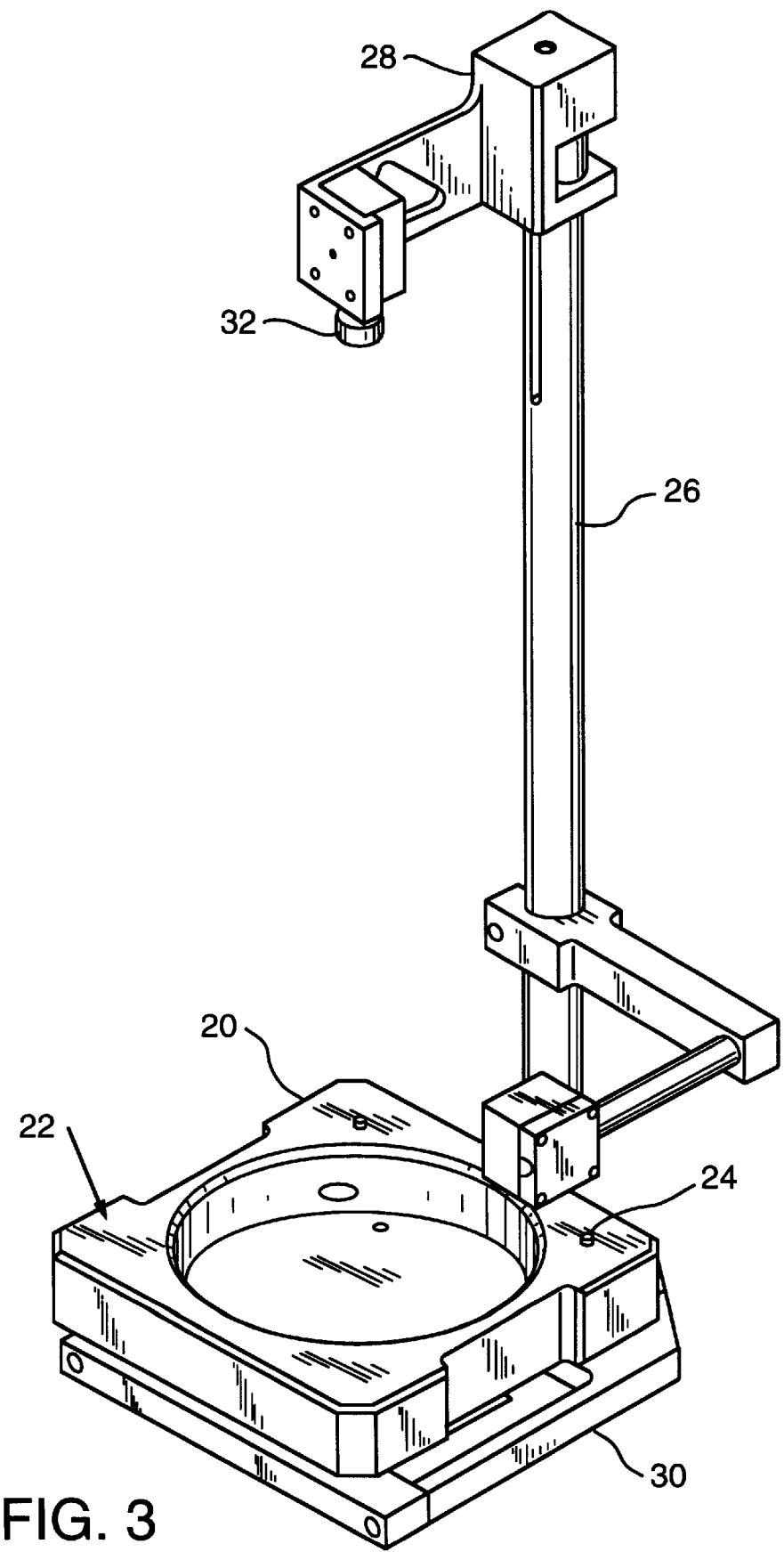
FIG. 3 is a wafer support, detector and source arrangement of an apparatus of the present invention.
Figure 4:
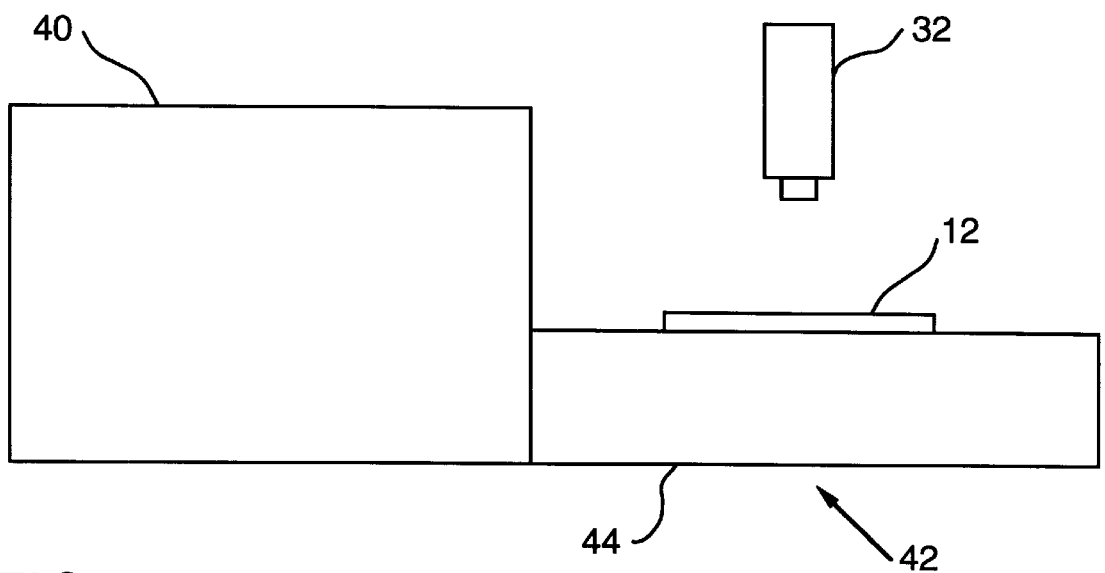
FIG. 4 is a schematic diagram showing present invention embodied in an off-load station of a die attach machine; and, FIG. 5 is a schematic diagram showing the present invention integrated with a pick head in a die attach machine of the present invention.

A shaft 26 is attached to support 20, preferably perpendicular to the plane of the support surface 22, and a detector mount 28 is attached to the shaft 26. In a preferred embodiment, the mount 28 is translatable along the shaft 26 to allow the radiation detector 32 attached to the mount 28 to be variably positioned with respect to the support 20. In addition, the mount 28 is securable to prevent the rotation of the mount in the plane of the support surface 22, such as through the use of a non-asymmetric shaft as in FIGS. 1 and 2, or a slot and pin arrangement as in FIG. 3. The skilled artisan will appreciate the mount 28 can be additionally translated in the plane of the support surface 22 and also rotated around and translated along the shaft 26 to allow the radiation detector 32 to be positioned to detect radiation from only a portion of the wafer 12 or from a single die 14. The translation of the mount 28 in all three directions also provides for optimal placement of the radiation detector 24 when different size wafers 12 are to be verified.

In a preferred embodiment, visible light is used to verity the presence or absence of the dice 11. The radiation source 30 is preferably a visible light source, such as an arc lamp, that is positioned beneath the support 20 opposite the support surface 22 to illuminate the inside ring of the support 20 and substrate side of the wafer 12, when the wafer 12 is positioned on the support surface 22. The source 30 is preferably positioned beneath the support 20 in close proximity to the support 20 to minimize the amount of the stray light that passes around the support 20 to the detector 32. Generally, an incoherent light source is sufficient to practice the invention; however, the invention can be used with coherent light sources, such as lasers, to provide a focused beam on a particular portion of the wafer 12 or a single die 11. Also, other light sources, such as infrared or ultraviolet, or other radiation sources, such as thermal or acoustic, can be used to practice the invention.

Figure 5:
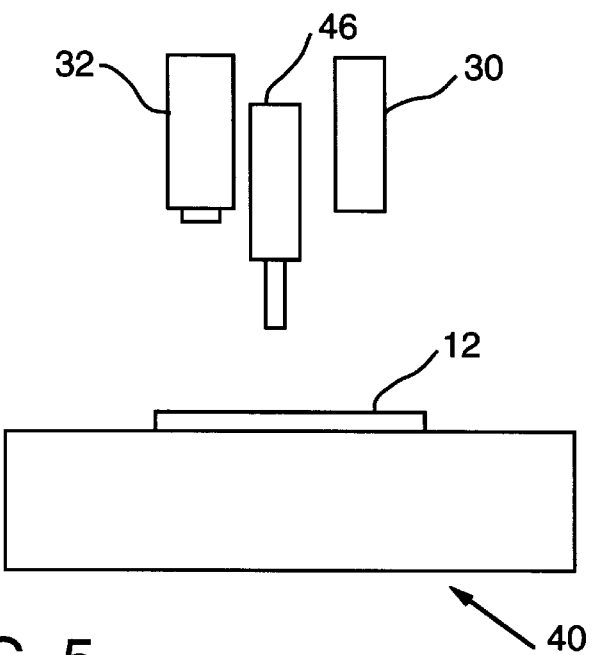

The radiation detector 32 can be directed toward the wafer support 20 either from a side opposing the radiation source 30 (FIGS. 1–4) or the same side as the radiation source 30 (FIG. 5). When the radiation detector 32 is positioned on the same side as the radiation source 30, the detected radiation will generally be reflected, emitted, or re-emitted from the wafer or apparatus.

In a preferred embodiment, the radiation detector 32 is a charge coupled device (CCD) camera. CCD cameras contain a plurality of detector that convert the detected visible light energy into electrical signals containing the detector location and the energy intensity that are transferred through electrical connections 34 to a controller 36. The camera 32 is generally positioned using the mount 28 to focus on the entire wafer 12 as previously discussed; however, the camera can be used to focus on portions of the wafer or a single die, if desired. The particular selection of the radiation detector 32 will of necessity be governed by the selection of the radiation source 30 and the resolution required to produce the verification map.

The controller 36 is preferably a computer having sufficient access to memory to recall previously stored wafer maps containing pertinent information, such as the planned die pick pattern for comparison with the data received from the detector 32. The computer should also have sufficient computational power and speed to produce die location wafer verification maps and perform a comparison with the planned die pick pattern maps in a desired time frame, and to store the results of the comparison to a file. The computer is preferably connected to a display monitor 38 to visually provide the results of the comparison in the form of a wafer map with differences highlighted, such as by color coding and/or blinking. The planned die pick pattern maps are recalled either by manually entering a tracking number for a particular wafer or in a preferred embodiment by scanning a bar code containing the track number that can be provided on the film frame 14. Computers having a 486 processor or faster have proven suitable for use with the invention for wafers tested up to approximately 1000 dice. However, the choice of processor need only be commensurate with the desired speed of the verification process.

The controller 36 may also be used to control the radiation source and generate a source signal for comparison with the receiver signal produced using the detected radiation. Also, a standard signal may be incorporated in the computation of the controller 36 to act as a filter for the receiver signal.

The present invention can be semi-integrally, or integrally incorporated in die attach or other pick and place machines. Conventional die attach machines 40 include a wafer off-load station 42 to which the wafers 12 are passed following die attach or pick operations. At the wafer off-load station 42, the wafer 12 is positioned on a heater 44 that is used to shrink and retighten the film supporting the cut water 12 following the pick operations. In the semi-integral configuration schematically shown in FIG. 4, the wafer 12 can be verified at this point by incorporating the radiation detector 32. The detector 32 could be a thermal detector, or another alternative is to use a visible light source to heat the wafer 12 and a CCD camera as the radiation detector 32. In the semi-integral configuration, a separate computer controller 36 may not be necessary because the die attach machine will generally have a computer controller associated with it that is already interfaced with the planned pick die wafer map for the wafer 12. Therefore, the radiation detector 32 can be tied directly into the die attach machine computer controller. This configuration also eliminates the need for reentry of the wafer identification data necessary at a separate die pick verification step, thereby eliminating a possible source of error.

In a fully integrated wafer verification system, the radiation source 30 and detector 32 can be positioned on the same side of the wafer support 20 in close proximity to the pick, or bond, head 46 in the die attach machine, as shown in FIG. 5. As with the semi-integral embodiment, only the radiation source 30 and radiation detector 32 are additional parts to the apparatus; the computer associated with the die attach machine can also be used for the verification operations. Also, with proper material selection it may be possible to eliminate the dedicated radiation source 30 and make use of background light to distinguish the dice 11.

In a preferred mode of operation for a stand alone apparatus, the wafer 12, that has been previously attached to the adhesive film in the frame 14 and cut to separate the dice 11, is removed from the wafer carrier 18 and the bar code on the wafer film frame 14 is scanned into the computer controller 36. The computer 36 retrieves the planned die pick pattern map corresponding to the bar code associated with the particular wafer 12.

The wafer 12 is then placed on the support surface 22 using the alignment notches 16 and the frame alignment pins 24 to ensure proper orientation of the wafer 12. The proper orientation of the wafer 12 provides a common reference point for aligning and comparing a resulting wafer verification map with the planned die pick map. The visible light radiation source 30 is used to illuminate the substrate side of the wafer 12 through the inside of the support ring 20 and through the film and frame assembly 14 from opposite the support surface 22.

The CCD camera detector 32 is focused on the entire wafer 12 from the side of the support surface 22 to receive the light from the source 30. The CCD camera 32 detects and converts the light energy into an electronic receiver signal containing the intensity of the light and the detector location. The receiver signal generated by the camera 32 is transferred to the computer 36.

The computer 36 generates a two dimensional intensity map based on the receiver signal, which converted into the wafer verification map by comparing the intensities with reference intensities corresponding to the presence and absence of a die from the wafer at the location. The wafer verification map is compared to the previously retrieved planned die pick map on a die by die basis. Preferably, a comparison wafer map is generated and displayed highlighting and providing the location of any differences between the verification map and the planned die pick map. The verification map and/or the comparison map can be stored for future use, or a discrepancy file can be saved. A similar procedure can be followed to determined the presence or absence of individual dice or the dice in a portion of a wafer by focusing on the individual die or the portion of the wafer, instead of generating the entire map.

In a semi-integral mode of operation, the wafer 12 is passed from the die attach portion of the machine to the off-load station 42 in the proper alignment for wafer verification following die attach operations. The planned die pick map is either maintained in the die attach computer, or passed to, or recalled by the stand alone computer 36. The film attached to the wafer 12 is then heated to shrink the film in the frame 14 using the radiation source 30. The radiation detector 32 detects the radiation and generates a receiver signal, which is passed to either the die attach or the stand alone computer 36 an the comparison occurs similar to the stand alone operation.

The result of the comparison of the stored wafer map with the verification map can also serve a quality control function for stand alone and semi-integrated apparatuses. A comparison of the results over time can be used to provide an indication of performance problems with the die attach or other pick and place machines, such as a repetitive error in picking particular die locations in a wafer.

In fully integrated mode of operation, the wafer 12 is brought into position in the die attach machine beneath the pick head 46 and the planned die pick pattern is retrieved by the die attach computer. In accordance with the planned die pick pattern a die is selected to attach to a substrate The die attach machine controller directs the movement of the pick head 46 to the location of the selected die and the picking of the die. The radiation source 30 directs radiation at the wafer 12 and the radiation detector 32 detects the radiation and generates receiver signals which are sent to the computer. The computer calculates the locations of the picked die and updates the wafer verification map. The updated wafer verification map is compared to the planned die pick wafer map to ensure that the selected die was actually picked by the die attach pick head 46. If the selected die was picked as determined by the calculations, the die is attached to a substrate and the identifier associated with the die is assigned to the substrate. If the selected die was not picked, the die attach computer determines whether the die at the calculated location is a good die or a bad die based on previously stored performance test results associated with the planned die pick wafer map. If the die at the calculated location is a good die, the calculated location of the die is assigned to the substrate, the die is attached to the substrate and the planned die pick map is updated to reflect the change in the pick sequence. If the picked die is bad, the computer instructs the machine to discard the bad die in an appropriate manner.

As one skilled in the art will recognize, the integrated procedure fully achieves the goals of removing bad dice for the process stream as soon as possible and eliminating the inadvertent discarding of good dice. However, because of economic concerns it may be more cost effective for production facilities with current generation die attach machines to use stand alone apparatuses at this time. The stand alone apparatuses are particularly well suited for use in current production facilities because of the low cost, small foot print and ease of repair of the apparatus and the fact that one strand alone apparatus can be used to serve multiple die attach machines.

Although the present invention has been described with respect to a die verification system, the method and apparatus may be employed for any system in which the presence or absence of components in a pattern must be verified. Those of ordinary skill in the art will appreciate the fact that there are a number of modifications and variations that can be made to specific aspects of the method and apparatus of the present invention without departing from the scope of the present invention. Such modifications and variations are intended to be covered by the foregoing specification and the following claims.

What is claimed is:

1. A method of verifying the absence of dice in a cut wafer comprising:

producing a wafer map to identify planned die pick locations in the wafer;

directing radiation toward the wafer;

detecting radiation from the direction of the wafer;

calculating the locations from which the dice have been removed based on the radiation detected by the detector; and, comparing the calculated location of the dice in the wafer with planned die pick locations to identify differences between the calculated locations and the planned die pick locations.

2. The method of claim 1, further comprising displaying the comparison of the planned and calculated locations.

3. The method of claim 2, wherein said displaying further comprises displaying the comparison as a wafer map and identifying the differences between the planned and calculated dice locations.

4. The method of claim 3, wherein said calculating, comparing and displaying are performed using a computer connected to a display monitor.

5. The method of claim 4, wherein:

said directing further comprises directing visible light toward the wafer; and, said detecting further comprises detecting light passing through locations in the wafer from which the dice have been removed.

6. The method of claim 1, wherein said detecting further comprises detecting radiation passing through locations in the wafer from which the dice have been removed.

7. The method of claim 1, wherein said detecting further comprises detecting radiation reflected from the wafer.

8. The method of claim 1, further comprising aligning the wafer to provide a common reference for comparing the calculated locations of the dice to the planned die pick locations.

9. The method of claim 1, further comprising:

producing a receiver signal from the detected radiation; and, displaying the receiver signal as a wafer verification map.

10. The method of claim 9, further comprising:

determining a standard signal to indicate whether a die is absent from the location; and, comparing the receiver signal to the standard signal.

11. At apparatus for verifying the absence of a die in a cut wafer comprising:

a wafer support;

a visible light source positioned to direct visible light through said wafer support;

a charge coupled device camera positioned to detect light from said light source passing through said wafer support and to generate receiver signals in response to the detected light; and, a controller attached to said camera to convert and display said receiver signals as a wafer verification map, wherein said controller accesses and compares a planned die pick pattern map with said wafer verification map, stores said comparison, and displays said comparison, said planned die pick pattern map and said wafer verification map.

12. The apparatus in claim 11, wherein said controller comprises a computer and a display screen.

13. The apparatus in claim 11, wherein:

said wafer support is ring shaped; and, said light source is positioned to direct light through said ring shape of said support.

14. An apparatus for picking dice from a cut wafer, comprising:

a wafer support;

a radiation source positioned to direct radiation toward said wafer support;

a radiation detector directed toward said wafer support to detect radiation from said radiation source;

a pick head positioned to access said wafer support and perform pick operations; and, a controller connected to and controlling said radiation detector, said radiation source and said pick head, said controller including a computer to access and compare a planned die pick pattern map with a wafer verification map generated by said computer from said detected radiation and control the movement of said pick head in accordance with said planned die pick pattern and said comparison.

15. A method of placing dice from a wafer onto substrates, comprising:

producing a wafer map to identify locations of the dice in the wafer;

testing the dice to determine whether the dice perform according to predetermined specifications;

selecting a die to be placed on a substrate;

identifying the location of the selected die on the wafer map;

picking the selected die from the wafer;

directing radiation toward the wafer;

detecting radiation from the direction of the wafer;

calculating the location of the picked die based on the radiation detected to determine whether the picked die is the selected die; and, placing the picked die on the substrate, when the picked die is the selected die.

16. The method of claim 15, further comprising discarding the die, when the die did not perform to the predetermined specifications.

17. The method of claim 15, further comprising:

assigning the calculated location of the die to the substrate; and, placing the die on the substrate, when the die performed to the predetermined specifications.

18. A method of verifying whether a selected die was picked from a wafer, comprising:

producing a wafer map to identify locations of the dice in the wafer;

picking a selected die from an identified location on the wafer;

directing radiation toward the wafer;

detecting radiation from the direction of the wafer;

calculating the location of the picked die based on the radiation detected; and, comparing the location of the picked die to the selected die to verify whether the picked die is the selected die.

19. An apparatus for picking dice from a cut wafer, comprising:

a die attach machine having a wafer support, a pick head positioned to access said wafer support and perform pick operations, and a controller connected to and controlling pick operations performed by said pick head;

a radiation source positioned to direct radiation toward said wafer support; and, a radiation detector attached to said controller and directed toward said wafer support to detect radiation from said radiation source, wherein said controller comprises a computer to access and compare a planned die pick pattern map with a wafer verification map generated by said computer from said detected radiation and control the movement of said pick head in accordance with said planned die pick pattern and said comparison.

20. An apparatus for picking dice from a cut wafer, comprising:

a die attach machine having an off-load station including a heater; and, a radiation detector directed toward said heater to detect radiation from said heater, wherein said radiation detector connected to a controller to access and compare a planned die pick pattern map with a wafer verification map to verify the dice picked from the wafer.

21. The apparatus of claim 20, wherein said radiation detector comprises an infrared radiation detector.

* * * * *